United States Patent [19]

Shimotsuhama et al.

[11] Patent Number: 4,928,024
[45] Date of Patent: May 22, 1990

[54] REFERENCELESS ECL LOGIC CIRCUIT

[75] Inventors: Isao Shimotsuhama, Kawasaki; Shinji Emori, Urawa; Yoshio Watanabe, Kawasaki; Masaya Tamamura, Tokyo, all of Japan

[73] Assignee: Fujitsu Limited, Kawasaki, Japan

[21] Appl. No.: 344,405

[22] Filed: Apr. 28, 1989

[30] Foreign Application Priority Data

May 13, 1988 [JP] Japan .................. 63-117627

[51] Int. Cl.$^5$ ................. H03K 19/013; H03K 19/086
[52] U.S. Cl. .................... 307/455; 307/443; 307/454; 307/494; 307/354
[58] Field of Search ............... 307/443, 454, 455, 494, 307/354, 356

[56] References Cited

U.S. PATENT DOCUMENTS

| 4,157,509 | 6/1979 | Zielinski | 307/354 X |
| 4,506,171 | 3/1985 | Evans et al. | 307/354 X |
| 4,626,709 | 12/1986 | Mazumder et al. | 307/455 |
| 4,687,953 | 8/1987 | Varadarajan | 307/455 X |
| 4,714,841 | 12/1987 | Shoji et al. | 307/455 |
| 4,719,371 | 1/1988 | Fujita et al. | 307/443 X |
| 4,745,582 | 5/1988 | Fukushi et al. | 365/189.07 X |
| 4,757,474 | 7/1988 | Fukushi et al. | 365/189.07 |

Primary Examiner—David Hudspeth
Attorney, Agent, or Firm—Staas & Halsey

[57] ABSTRACT

An ECL transistor pair is connected in parallel with a third transistor. A complementary signal is applied to the transistor pair. A high level of a signal that is applied to the third transistor is effectively higher than a high level of the input to the pair of transistors; and a low level of the signal applied to the third transistor is effectively lower than the high level of the input to the pair of transistors. The low level input to the third transistor enables the ECL circuit to output the complementary input signal and assures high speed ECL operation. The high level of the input to the third transistor disables the ECL circuit from outputting the complementary input signal.

28 Claims, 6 Drawing Sheets

FIG. 5(a)
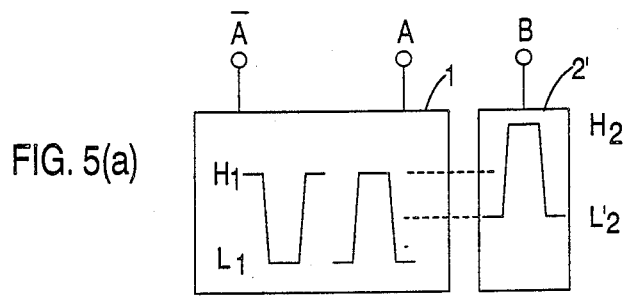
FIG. 5(b)
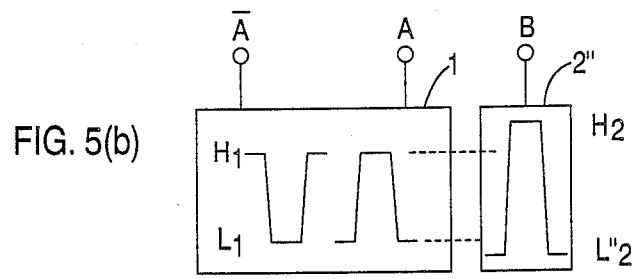
FIG. 6
| A | $\bar{A}$ | B | Q | $\bar{Q}$ |
|---|---|---|---|---|
| H | L | H | H | L |
| L | H | H | H | L |
| H | L | L | H | L |
| L | H | L | L | H |

| A | $\overline{A}$ | B | C | Q | $\overline{Q}$ |
|---|---|---|---|---|---|
| H | L | H | H | H | L |
| L | H | H | H | H | L |
| H | L | L | H | H | L |
| L | H | L | H | H | L |
| H | L | H | L | H | L |
| L | H | H | L | H | L |
| H | L | L | L | H | L |
| L | H | L | L | L | H |

FIG. 9
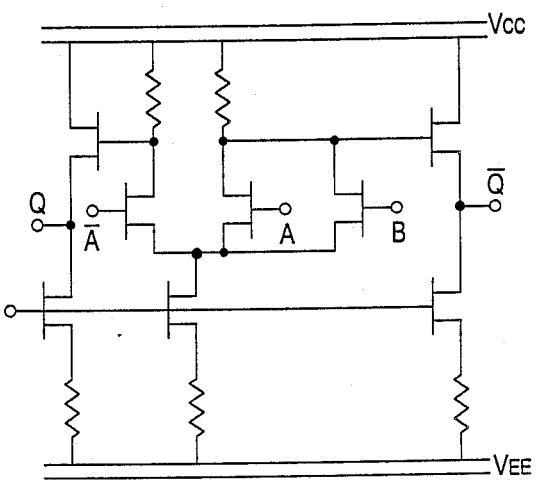
FIG. 10
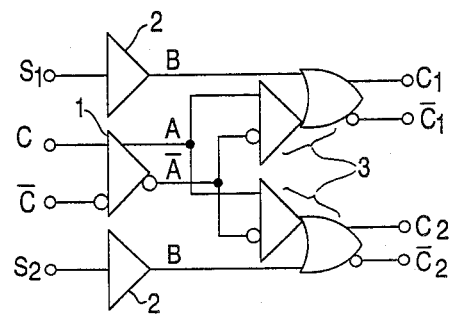
FIG. 11
| $S_1$ | $S_2$ | C | $\bar{C}$ | $\bar{C_1}$ | $C_1$ | $C_2$ | $\bar{C_2}$ |
|---|---|---|---|---|---|---|---|
| L | L | H | L | H | L | H | L |
| L | L | L | H | L | H | L | H |
| H | L | H | L | H | L | H | L |
| H | L | L | H | H | L | L | H |
| L | H | H | L | H | L | H | L |
| L | H | L | H | L | H | H | L |
| H | H | H | L | H | L | H | L |
| H | H | L | H | H | L | H | L |

REFERENCELESS ECL LOGIC CIRCUIT

FIELD OF THE INVENTION

This invention relates to a differential-input type logic circuit; and more particularly, to a high speed differential circuit having a plurality of the logical inputs.

DESCRIPTION OF THE RELATED ART

A differential-input type logic circuit, generally called an emitter-coupled logic (hereinafter "ECL") or a current-mode logic (hereinafter "CML"), is widely used because of its high speed switching capability. FIG. 1 is a schematic diagram of a high speed ECL. In FIG. 1, a first transistor $Q_1$, of paired transistors forming an ECL, is connected to receive a reference voltage $V_{ref}$. A second transistor $Q_2$ of the paired transistors is connected in parallel with a third transistor $Q_3$. Generally, there must be an input voltage difference between the differential inputs A and C. Accordingly, a logical high level (hereinafter "H level") and a logical low level (hereinafter "L level") are respectively applied to the second and third transistors $Q_2$ and $Q_3$. Typically, these levels are respectively 0.3 V higher and lower than a reference voltage $V_{REF}$. In other words, there is a peak-to-peak voltage differential between the inputs of 0.6 V, as shown in FIG. 1.

In FIG. 1, the input signal levels are illustrated as pulses below the corresponding input terminals to which the signal is applied. The 0.3 V difference from the reference voltage $V_{ref}$ is required to switch the current flowing through the paired transistors in response to only one of the input signals. This allows a margin for noise. In the FIG. 1 example, clock pulses are applied to the second transistor $Q_2$. The clock pulses are enabled/disabled by a signal B applied to the third transistor $Q_3$.

A circuit such as shown in FIG. 1 that uses a reference voltage is referred to hereinafter as a reference voltage method circuit. Reference voltage method circuits have disadvantages at high clock pulse switching speeds. This is because, as shown in FIG. 3, the rise/fall time $t_1$ for a 0.6 V peak-to-peak input signal requires, roughly speaking, twice the rise/fall time $t_2$ of a 0.3 V peak-to-peak input signal that is used by an ECL circuit that does not employ a reference voltage method circuit. In this type of ECL circuit, paired transistors fully perform the differential operation; that is, when one of the base electrode voltages is increased, the other base electrode voltage is decreased.

Another ECL type logic circuit capable of receiving a plurality of logical input signals, and having different input voltage levels is shown in FIG. 2. Such a circuit is disclosed in U.S. Pat. No. 4,745,582 to Fukushi, et al. In FIG. 2, an ECL circuit comprises first and second transistors $Q_5$ and $Q_6$ connected in parallel; a third transistor $Q_7$; and a current source IS2 connected to the emitters of the three transistors $Q_5$, $Q_6$ and $Q_7$. A collector electrode of the third transistors $Q_7$ is directly connected to the power source $V_{cc}$. Collectors of the parallel transistors $Q_5$ and $Q_6$ are connected together to a power source $V_{cc}$ through a resistor. The collectors provide an output via an output transistor $Q_8$. The output corresponds to the logic operation performed by the circuit.

In FIG. 2, an OR/NOR operation of inputs A and B is enabled when an input to the third transistor $Q_7$ is high. The high level for $Q_7$ is chosen to be between the high level and the low level of the inputs A and B. The OR/NOR operation of the inputs A and B is disabled when the input to the third transistor $Q_7$ is low. The low level for $Q_7$ is chosen to be lower than the lower of the inputs A and B. The high level input to the third transistor $Q_7$ acts as a reference voltage for the inputs A and B, which have a peak-to-peak 0.6 V amplitude differential.

If the FIG. 2 circuit is used as a clock pulse distributor, then complementary clock pulses are input to the first and third transistors $Q_5$ and $Q_7$ (as shown in FIG. 2) in the same manner as shown in FIG. 1. The term "complementary" indicates that the two input signals seesaw through levels, but are not symmetric, as discussed in more detail below.

The signal levels for the input $\overline{A}$ are chosen such that its high level H' is between the high and its low levels (H and L) of the inputs A/B, and its low level L' is lower than the low level (L) of the inputs A/B. The input B to the second transistor $Q_6$ controls the effect of the clock pulses $A/\overline{A}$ A on the circuit. When the clock pulses are enabled by a low level L at the input B to transistor $Q_6$, the low level L acts as a reference voltage for the third transistor $Q_7$. Accordingly, the amplitudes of the inputs A and $\overline{A}$, i.e., the clock pulse, must be as large as 0.6 V, which causes the same disadvantage as described with respect to the FIG. 1 circuit. When the input B is at the high level H, the output of the ECL is always low, regardless of the logical levels of the inputs A and $\overline{A}$; thus, the clock pulses are disabled or blocked from the output.

SUMMARY OF THE INVENTION

It is a general object of the invention to provide a high speed ECL/CML-type logic circuit operating with a plurality of logical inputs thereto.

In accordance with the present invention, a pair of transistors forming an ECL/CML-type differential amplifier is driven by complementary pulse signals. One of these transistors is connected in parallel with at least one additional transistor. The additional transistor is connected to receive a signal that has a high level that is effectively higher than the high level of the input signals to the pair of transistors, and a low level that is effectively lower than the high level of the input signals to the pair of transistors.

When a low level is applied to the additional transistor, the pair of transistors perform a differential operation so as to provide an output varying in accordance with the complementary inputs. When a high level is applied to the additional transistor, the pair of transistors is dominated by the high level applied to the additional transistor. Accordingly, complementary input signals applied to the pair of transistors are blocked from the output of the circuit. The above-described circuit provides the advantages of high speed ECL/CML switching and of amplifying the complementary signal.

The above-mentioned features and advantages of the present invention, together with other objects and advantages, will become more apparent, and will be more fully described hereinafter, with reference to the accompanying drawings. In the drawings, like numerals refer to like parts throughout.

BRIEF DESCRIPTION OF THE DRAWINGS

FIG. 4 (c) is a schematic diagram of a second driving circuit connectable to inputs of the ECL circuit of FIG. 4(a) to provide a larger input signal;

FIG. 5(a) is a diagram showing a variation of signal levels at the outputs of the second driving circuit shown in FIG. 4(c);

FIG. 5(b) is a diagram showing another variation of signal levels at the outputs of the second driving circuit shown in FIG. 4(c);

FIG. 6 is a truth table of the logic operation of the FIG. 4(a) circuit;

FIG. 9 is a schematic diagram of another preferred embodiment of an ECL circuit employing GaAs source coupled FET logic in place of the FIG. 4(a) circuit components according to the present invention.

FIG. 10 is a logic diagram of a clock pulse distributor embodying circuits of the present invention.

FIG. 11 is a truth table of the logic operation of the circuit of FIG. 10.

DESCRIPTION OF THE PREFERRED EMBODIMENTS

Figure 4A:
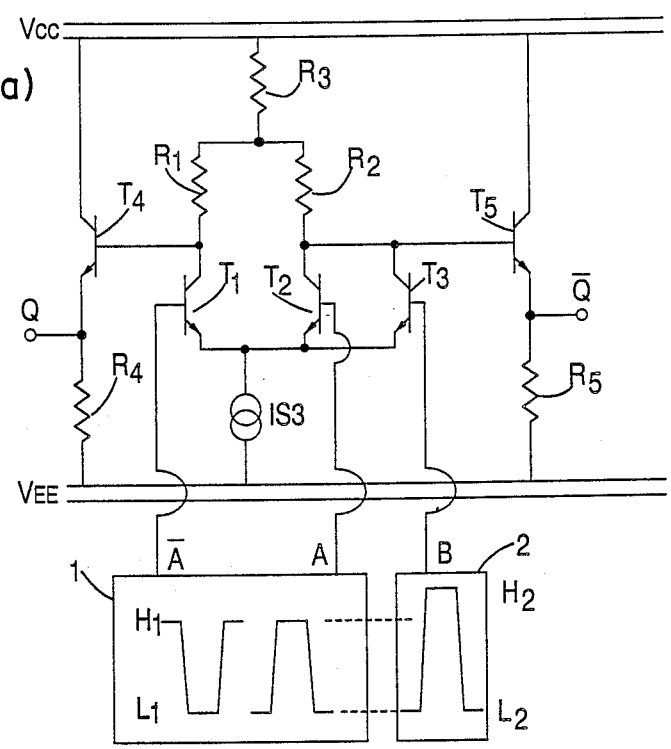
FIG. 4(a) is a schematic diagram of a preferred embodiment of an ECL circuit according to the present invention.
Figure 4B:
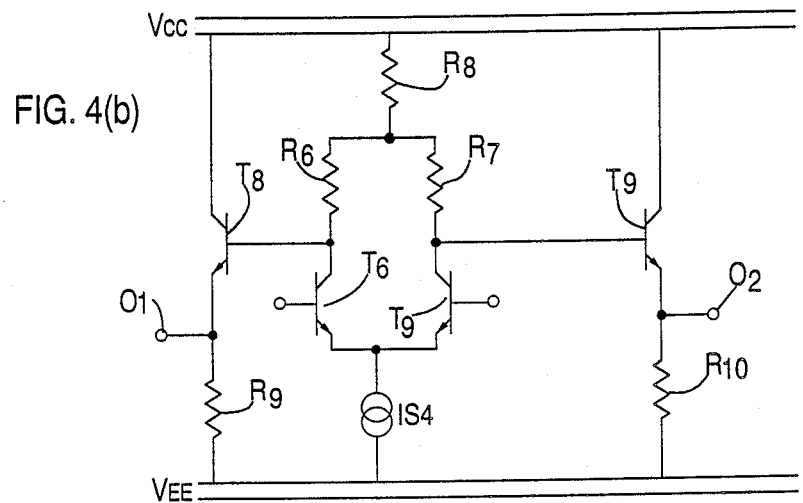
FIG. 4 (b) is a schematic diagram of a first driving circuit connectable to inputs of the ECL circuit of FIG. 4(a)
Figure 4C:
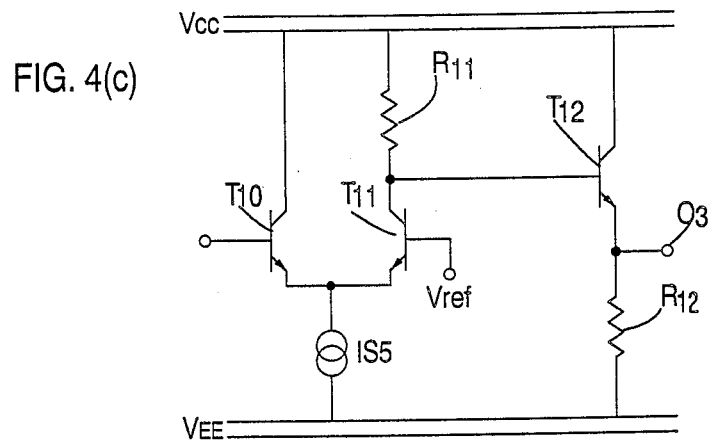

Referring to FIGS. 4(a) through 4(c), and to FIG. 5, a preferred embodiment of the present invention is hereinafter described in detail. A pair of first and second transistors $T_1$ and $T_2$ form a CML-type differential amplifier, and a third transistor $T_3$ is connected in parallel with a second transistor $T_2$. Emitter electrodes of the three transistors $T_1$, $T_2$ and $T_3$ are connected together to a constant-current source IS3. Another terminal of constant-current source IS3 is connected a negative terminal $V_{EE}$ to receive, for example, $-5.2$ V, provided by a direct current (DC) power source (not shown). The constant-current source IS3 provides a constant DC current of, for example, 1 mA. The details of a constant-current source such as IS3 are well known to those skilled in the art; and thus, are not shown in the figures. A constant current source such as IS3 can comprise a transistor having a resistor serially connected to the emitter electrode and having a constant voltage applied to its base electrode.

In FIG. 4(a), a resistor $R_1$ having, for example, a resistance value 300 ohms, is connected between a common resistor $R_3$ having, for example, a resistance value 300 ohms and collector electrode of the first transistor $T_1$. Another end of the common resistor $R_3$ is connected to a positive terminal $R_2$, to receive, for example, 0 V provided by a DC power source (not shown). A resistor $R_2$ having a resistance value of, for example, of 300 ohms, is connected between the common resistor $R_3$ and collector electrodes of the second and third transistors $T_2$ and $T_3$. Collector electrodes of the first and second transistors $T_1$ and $T_2$ are respectively connected to base electrodes of fourth and fifth transistors $T_4$ and 5that have respective emitters connected to a resistor $R_4$ and a resistor $R_5$. Thus, the signal generated at each collector electrode of transistors $T_1$ and $T_2/(T_3)$ is amplified and output as output signal Q and $\overline{Q}$ from each emitter electrode of the fourth and fifth transistors $T_4$ and $T_5$.

The respective base electrodes of the first transistor $T_1$ and of the second transistor $T_2$ are respectively connected to output terminals $O_1$ and $O_2$ of a first ECL driving circuit shown in FIG. 4(b). In the first driving circuit shown in FIG. 4(b), emitter electrodes of a pair of sixth and seventh transistors $T_6$ and $T_7$ are connected together and to a constant current source IS4 that provides, for example, 1 mA. The constant current source IS4 has a structure similar to that of IS3 discussed with regard to FIG. 4(a). A resistor $R_6$ and a resistor $R_7$ each have a resistance of, for example, 300 ohms and are respectively connected to collector electrodes of $T_6$ and $T_7$. The resistors $R_6$ and $R_7$ are connected to a common resistor $R_8$ having a resistance value, for example, 300 ohms, which in turn has another end connected to receive the DC Voltage $V_{cc}$. Output transistors $T_8$ and $T_9$ and resistors $R_9$ and $R_{10}$ perform a function similar to that of transistors $T_1$ and $T_2$ and resistors $R_4$ and $R_5$ shown in FIG. 4(a).

A base electrode of the third transistor $T_3$ is connected to an output terminal $O_3$ of a second ECL driving circuit shown in FIG. 4(c). In the second driving circuit, emitter electrodes of a pair of tenth and eleventh transistors $T_{10}$ and $T_{11}$ are connected together and to a constant current source IS5 that provides, for example, 1 mA. The current source IS5 has a structure similar to that of IS3 discussed with regard to FIG. 4(a). A resistor $R_{11}$ having a resistance value of, for example, 600 ohms, connects a collector electrode of the eleventh transistors $T_{11}$ to receive the DC voltage $V_{cc}$. A collector electrode of the tenth transistor $T_{10}$ is directly connected to receive the DC voltage $V_{cc}$. An output transistor $T_{12}$ and a resistor $R_{12}$ perform a function similar to that of transistor $T_5$ and resistor $R_5$ shown in FIG. 4(a).

Signal levels at outputs terminals $O_1$ and $O_2$ of the first driving circuit (i.e., the inputs A and $\overline{A}$ to the first and second transistors $T_1$ and $T_2$), are such that the high level $H_1$ is typically $-1.2$ V, and the low level $L_1$ is typically $-1.5$ V. Signal levels of the output from the terminal $O_3$ of the second driving circuit (i.e. the input B to the third transistor $T_3$), is such that the high level $H_2$ is typically $-900$ mV, which is 300 mV higher than the high level $H_1$ of the signals A/$\overline{A}$ of the first driving circuit, and the low level $L_2$ is typically $-1.5$ V, which is essentially same as the low level $L_1$ of the input A and $\overline{A}$ to the first and second transistor $T_1$ and $T_2$. Thus, 300 mV is provided as an effective difference from the high level of the input A/$\overline{A}$ so as to make allowances for possible noise problems. The relative levels of the input signals A, $\overline{A}$ and B are illustrated below the corresponding input terminals in FIG. 4(a).

When the input B to the third transistor $T_3$ is at the low level $L_2$, the third transistor $T_3$ does not affect the differential operation of the first and second transistors $T_1$ and $T_2$. Complementary signal inputs, for example clock pulses A and $\overline{A}$, are therefore provided as outputs Q and $\overline{Q}$; in other words, a clock signal is output. When the input B to the third transistor $T_3$ is at the high level $H_2$, the third transistor $T_3$ dominates over the high level $H_1$ input to the first transistor $T_1$. Consequently, current is switched from the first transistor $T_1$ to the third transistor $T_3$. In this state, the complementary input signals, i.e., the clock pulses, A and $\overline{A}$, are blocked from the output. The FIG. 4(a) circuit performs an OR/NOR operation in accordance with the logic shown in truth table of FIG. 6.

Although, in the above-described preferred embodiment, the low level $L_2$ of the input B is essentially same as the low level $L_1$ of the inputs A and $\overline{A}$, the low level $L_2$ can be chosen to be higher, e.g., $L_2'$ in FIG. 5(a) or lower, e.g., $L_2''$ in FIG. 5(b), than the low level $L_1$ of the inputs A and $\overline{A}$. The low level $L_2'$ or $L_2''$ must, however, be effectively lower than the high level $H_1$ of the inputs A and $\overline{A}$, as described previously. With the smaller amplitude of the input B as shown in FIG. 5(a), the pulse rise/fall time of the input B can be shorter. However, the lower level $L_2'$ also functions as a reference voltage to the input $\overline{A}$.

Thus, when the input A is lower than the low level $L_2'$, the input A does not aid in the current switching initiated by the input $\overline{A}$. As a result, the switching speed of the ECL due to the inputs A and $\overline{A}$ is slowed.

To compensate for this deteriorated switching speed, the amplitude of the input signals A and $\overline{A}$ must be increased. Selection of an appropriate low level ($L_2$, $L_2'$ or $L_2''$) is determined as a compromise between the switching speed due to the signal A/$\overline{A}$ and the signal B and upon circuit requirements. Generally, in a clock pulse distributor, the switching speed of the clock pulse is more important than the switching speed of the enable/disable signal pulse B. Therefore, the amplitude of the enable/disable signal pulse B are generally chosen larger than the clock signal pulse A/$\overline{A}$. Consequently, the rise/fall times of the enables/disable signal pulse B is generally longer than those of the clock signal pulse A/$\overline{A}$. Moreover, in a clock pulse distributor, even though the amplitude of the enable/disable signal pulse B is chosen larger than that of the clock signal pulse A/$\overline{A}$, the overall operation speed of the entire circuit is not deteriorated because the frequency of the clock signal pulse A/$\overline{A}$ is much higher than that of the enable/disable signal.

Figures 7, 8:
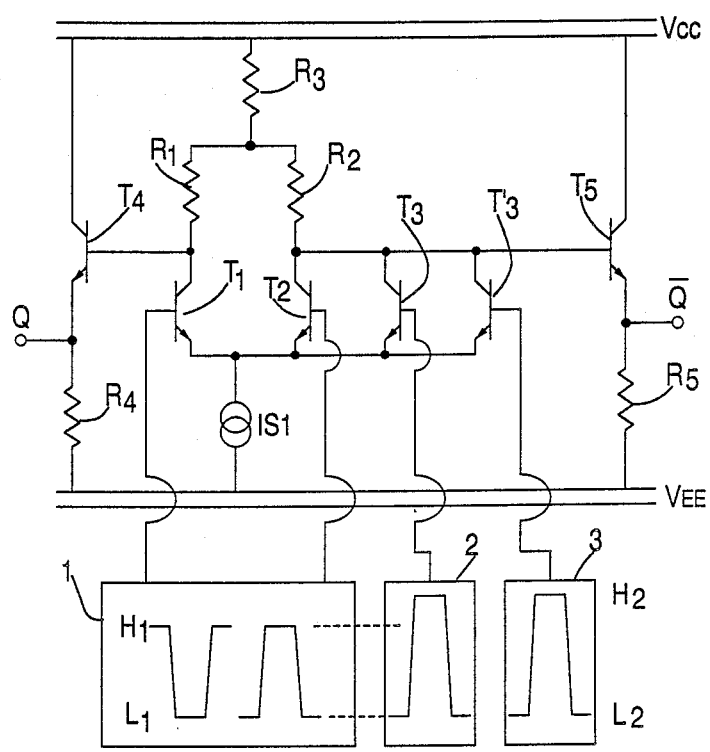
FIG. 7 is a schematic diagram of another preferred embodiment of an ECL circuit according to the present invention.
FIG. 8 is a truth table of the logic operation of the FIG. 7 circuit.

FIG. 7 is a schematic circuit diagram of a second preferred embodiment of the present invention; and FIG. 8 is a truth table of the logic operation of the FIG. 7 circuit. The circuit of the second preferred embodiment is the same as that of the first preferred embodiment shown in FIG. 4(a) except for an additional transistor $T_3'$. The additional transistor $T_3'$ is connected to a third driving circuit and is connected in parallel with the third transistor $T_3$. A base electrode of the additional transistor $T_3'$ is connected to the third driving circuit, which has a structure and provides output levels that are substantially the same as those of the second driving circuit. Accordingly, when the input C to the transistor $T_3'$ is at a high level, the additional transistor $T_3'$ dominates the operation of the first and second transistors $T_1$ and $T_2$. Thus, the three inputs A, B and C perform an OR/NOR operation in accordance with the logic shown in the truth table of FIG. 8.

Although in the above-described preferred embodiments of the present invention the ECL circuits include bipolar transistors, it is apparent that the present invention can also be embodied with source coupled FET logic (SCFL) comprising Gallium Arsenide (GaAs) FETs (field effect transistor). One such embodiment is shown in FIG. 9, which corresponds to the circuit shown in FIG. 4(a).

FIG. 10 is a logic diagram of a clock pulse distributor embodying the present invention; and FIG. 11 is a truth table of the logic operation of the FIG. 10 circuit. In FIG. 10, reference numerals 1 and 2 identify the first and second driving circuits, respectively. Reference numeral 3 identifies the ECL circuit shown in FIG. 4(a). The signals A, $\overline{A}$ and C correspond to the those of FIGS. 4(a)–4(c). A complementary clock pulse signal C/$\overline{C}$ is divided into two pulse groups $C_1/\overline{C}_1$ and $C_2/\overline{C}_2$. Signals $S_1$ and $S_2$ enable/disable the output clock pulse $C_1/\overline{C}_1$ and $C_2/\overline{C}_2$, respectively.

As described above, the distribution of a high speed clock pulse can be controlled by signals $S_1$ and $S_2$, respectively, while maintaining the high speed advantage of ECL. The circuit configuration according to the present invention is particularly advantageous in a standard cell type LSI (large scale integrated circuit) where an unused output terminal of the clock pulse distributor must be kept at a DC voltage so that noise radiation therefrom is prevented. Without employing the circuit configuration having the signal level conditions of the present invention, reference voltage method circuits must be employed. As noted above, in such circuits, the input clock pulse amplitude must be large, and as a result, the operational speed of the entire LSI is reduced.

Figure 1:
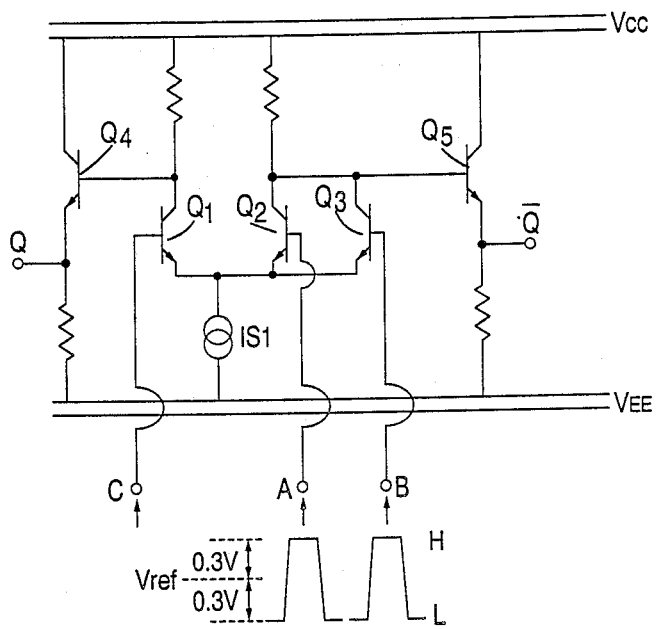
FIG. 1 is a schematic diagram of a prior art ECL circuit having plural logical inputs and employing a reference voltage.
Figure 2:
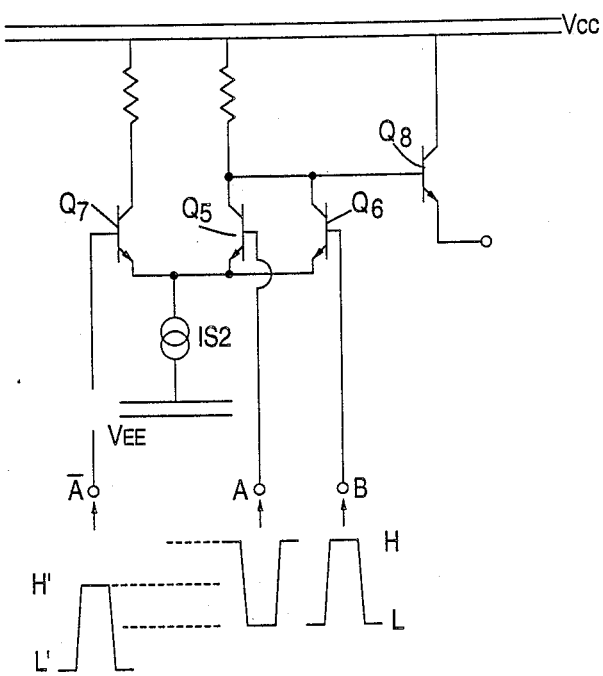
FIG. 2 is a schematic diagram of another prior art ECL circuit having plural logical inputs.
Figure 3A:
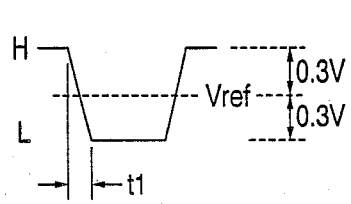
FIG. 3(a) is a diagram showing signal levels and rise/fall times of the input signals of a reference voltage method circuit.
Figure 3B:
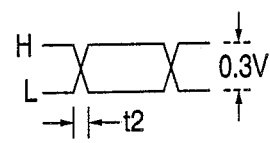
FIG. 3(b) is a diagram showing signal levels and rise/fall times of the input signals of an ECL circuit not using a reference voltage.

In circuits embodying the present invention, the pulse delay time of the output pulse with respect to the input pulses $\overline{A}$/A respectively applied to transistors $T_1$ and $T_2$ in the circuit of FIG. 4(a) is as short as 80 ps, compared with 100 ps of the corresponding prior art circuit of FIG. 1. Clock pulse frequencies can therefore be increased when employing the present invention.

Although the preferred embodiments have been described as using NPN ECL circuits, it is apparent that the present invention can also be applied to an ECL/CML circuit comprising PNP transistors. In such a modification, the condition "the level $H_2$ is higher than the other high level $H_1$" is replaced with a condition "a low level $L_2$ of the input B is lower than the low level $L_1$ of the complementary inputs A/$\overline{A}$, so that the operation of the third transistor can dominate over the first transistor.

In the above-described preferred embodiments, either or both of the two output transistors $T_4$ and $T_5$ can be omitted. The voltage levels and the resistance values, etc., referred to in the above-described preferred embodiments are only examples. Therefore, it is apparent that these circuit values can be modified as needed; and the common resistors, such as $R_3$ or $R_8$, can be omitted, as long as the level conditions of the present invention are satisfied.

The many features and advantages of the invention are apparent from the detailed specification and thus, it is intended by the appended claims to cover all such features and advantages of the system which fall within the true spirit and scope of the invention. Further, since numerous modifications and changes may readily occur to those skilled in the art, it is not desired to limit the invention to the exact construction and operation shown and described, and accordingly, all suitable modifications and equivalents may be resorted to, falling within the scope of the invention.

We claim:

1. A logic circuit comprising:
   a first NPN transistor and a second NPN transistor connected as a differential amplifier;
   a third NPN transistor connected in parallel with said second transistor;
   first driving means for driving said first and second NPN transistors with complementary signals having high and low levels; and
   second driving means for driving said third NPN transistor with an output signal having a high level that is higher than the high levels of said complementary signals, and having a low level that is lower than the high levels of said complementary signals.

2. A logic circuit according to claim 1, wherein said second driving means includes:
   means for generating the low level of the output signal such that the low level is substantially equal to the low levels of said complementary signals.

3. A logic circuit according to claim 1, wherein said second driving means includes:
   means for generating the low level of the output signal such that the low level is lower than the low levels of the said complementary signals.

4. A logic circuit according to claim 1, wherein said second driving means includes:
   means for generating the low level of the output signal such that the low level is higher than the low levels of the said complementary signals.

5. A logic circuit according to claim 1, further comprising:
   a constant current source, and wherein
   each of said first, second and third NPN transistors have emitters that are operatively connected to each other, and connected to said constant-current source.

6. A logic circuit according to claim 5, wherein said constant-current source comprises:
   a fourth transistor;
   a resistor serially connected to an emitter electrode of said fourth transistor; and
   means for providing a constant voltage to a base electrode of said fourth transistor.

7. A logic circuit according to claim 5, wherein said constant-current source comprises a resistor.

8. A logic circuit according to claim further comprising:
   a resistor operatively connected to receive a collector power source voltage and operatively connected to one of a collector of said first transistor and of said second transistor,
   whereby a logic signal is output from said collector connected to said resistor.

9. A logic circuit according to claim 1, wherein said complementary signals have rise and fall times, and wherein said second driving means includes:
   means for generating the output signal so as to have a rise time and a fall time that are longer than those of said complementary signals.

10. A logic circuit according to claim 1, wherein said complementary signals have a frequency and wherein said second driving means includes:
    means for generating the output signal so as to have a frequency that is lower than that of said complementary signals.

11. A logic circuit comprising:
    a first PNP transistor and a second PNP transistor connected as a differential amplifier;
    a third PNP transistor connected in parallel with said second transistor;
    first driving means for driving said first and second PNP transistors with complementary signals having high and low levels; and
    second driving means for driving said third PNP transistor with an output signal having a low level that is lower than the low levels of said complementary signals, and having a high level that is higher than the low levels of said complementary signals.

12. A logic circuit according to claim 11, wherein said second driving means includes:
    means for generating the high level of the output signal such that the high level is substantially equal to the high levels of said complementary signals.

13. A logic circuit according to claim 11, wherein said second driving means includes:
    means for generating the high level of the output signal such that the high level is higher than the high levels of said complementary signals.

14. A logic circuit according to claim 11, wherein said second driving means includes:
    means for generating said high level of the output signal such that the high level is lower than the high levels of said complementary signals.

15. A logic circuit according to claim 11, further comprising:
    a constant current source, and wherein
    each of said first, second and third PNP transistors have emitters that are operatively connected to each other, and connected to said constant-current source.

16. A logic circuit according to claim 15, wherein said constant-current source comprises:
    a fourth transistor;
    a resistor serially connected to an emitter electrode of said fourth transistor; and
    means for providing a constant voltage to a base electrode of said fourth transistor.

17. A logic circuit according to claim 15, wherein said constant-current source comprises a resistor.

18. A logic circuit according to claim 11, further comprising:
    a resistor operatively connected to receive a collector power source voltage and operatively connected to one of a collector of said first transistor and of said second transistor,
    whereby a logic signal is output from said collector connected to said resistor.

19. A logic circuit according to claim 11, wherein said complementary signals have rise and fall times, and wherein said second driving means includes:
    means for generating the output signal so as to have a rise time and a fall time that are longer than those of said complementary signals.

20. A logic circuit according to claim 11, wherein said complementary signals have a frequency and wherein said second driving means includes:

means for generating the output signal so as to have a frequency that is lower than that of said complementary signals.

21. A logic circuit comprising:
a first transistor and a second transistor connected as a differential amplifier;
a third transistor connected in parallel with said second transistor;
first driving means for driving said first and second transistors with complementary signals having high and low levels; and
second driving means for driving said third transistor with an output signal having a high level that is higher than the high levels of said complementary signals, and having a low level that is lower than the low levels of said complementary signals.

22. A logic circuit according to claim 21, further comprising:
a constant current source, and wherein
each of said first, second and third transistors have emitters that are operatively connected to each other, and connected to said constant-current source.

23. A logic circuit according to claim 21, wherein said constant-current source comprises:
a fourth transistor;
a resistor serially connected to an emitter electrode of said fourth transistor; and
means for providing a constant voltage to a base electrode of said fourth transistor.

24. A logic circuit according to claim 21, wherein said constant-current source comprises a resistor.

25. A logic circuit according to claim 21, further comprising:
a resistor operatively connected to receive a collector power source voltage and operatively connected to one of a collector of said first transistor and of said second transistor,
whereby a logic signal is output from said collector connected to said resistor.

26. A logic circuit according to claim 21, wherein said complementary signals have a frequency and wherein said second driving means includes:
means for generating the output signal so as to have a frequency that is lower than that of said complementary signals.

27. A logic circuit according to claim 21, wherein said complementary signals have rise and fall times, and wherein said second driving means includes:
means for generating the output signal so as to have a rise time and a fall time that are longer than those of said complementary signals.

28. A logic circuit according to claim 20, wherein said complementary signals have a frequency and wherein said second driving means includes:
means for generating the output signal so as to have a frequency that is lower than that of said complementary signals.

* * * * *

UNITED STATES PATENT AND TRADEMARK OFFICE
CERTIFICATE OF CORRECTION

PATENT NO. : 4,928,024
DATED : May 22, 1990
INVENTOR(S) : ISAO SHIMOSUHAMA

It is certified that error appears in the above-identified patent and that said Letters Patent is hereby corrected as shown below:

Col. 4, line 11, "$_5$that" should be --$T_5$ that--.
Col. 7, line 54, "claim" should be --claim 1--.

Signed and Sealed this

Twenty-eighth Day of May, 1991

Attest:

HARRY F. MANBECK, JR.

*Attesting Officer*   Commissioner of Patents and Trademarks